United States Patent [19]

Reiner

[11] Patent Number: 4,532,438
[45] Date of Patent: Jul. 30, 1985

[54] MONOLITHICALLY INTEGRABLE MOS-COMPARATOR CIRCUIT

[75] Inventor: Robert Reiner, Lynn East, South Africa

[73] Assignee: Siemens Aktiengesellschaft, Berlin and Munich, Fed. Rep. of Germany

[21] Appl. No.: 396,142

[22] Filed: Jul. 7, 1982

[30] Foreign Application Priority Data

Jul. 31, 1981 [DE] Fed. Rep. of Germany ....... 3130391

[51] Int. Cl.³ .............................................. H03K 5/24
[52] U.S. Cl. .................................... 307/362; 307/355; 307/530; 340/347 AD; 340/347 M
[58] Field of Search .... 340/347 AD, 347 M, 347 CC; 307/279, 355–356, 360–362, 451, 530; 328/146

[56] References Cited

U.S. PATENT DOCUMENTS

| 3,676,702 | 7/1972 | McGrogan, Jr. | 307/355 |
| 4,211,942 | 7/1980 | Aoki et al. | 307/356 |
| 4,250,406 | 2/1981 | Alaspa | 307/279 X |
| 4,316,105 | 2/1982 | Fowler | 307/355 X |

OTHER PUBLICATIONS

Glincman, CMOS/SOS Flash ADC Speeds on Low Power for Low Cost, Electronic Design, 22, Nov. 1980, pp. 227–231.

Primary Examiner—T. J. Sloyan
Attorney, Agent, or Firm—Herbert L. Lerner; Laurence A. Greenberg

[57] ABSTRACT

A circuit of a monolithically integrable MOS-comparator has a capacitor, a signal input and a reference input of the comparator being alternatingly connected to the capacitor via respective first and second clock-controlled transfer transistors, a first amplifier stage having a control input and an output, the capacitor being directly connected to the control input and being also connected via a third transfer transistor to the output of the first amplifier stage, a second amplifier stage having a control input and an output, the output of the first amplifier stage being further connected via a fourth transfer transistor to the control input of the second amplifier stage. A third amplifier stage identical with the first and second amplifier stages has a signal input and an output, the output of the second amplifier stage being a first signal output of the comparator and being also connected to the signal input of the third amplifier stage. The output of the third amplifier stage as a second signal output of the comparator and as connected via a fifth transfer transistor to the control input of the second amplifier stage. Means for transmitting two clock signals are connected to the first and second transfer transistors, respectively, for alternatingly switching the signal input and the reference input, respectively, of the comparator to the capacitor, the signal-transmitting means being also connected to the third, fourth and fifth transfer transistors for controlling the same.

2 Claims, 3 Drawing Figures

MONOLITHICALLY INTEGRABLE MOS-COMPARATOR CIRCUIT

The invention relates to a monlithically integrable MOS-comparator circuit for comparing a signal voltage to be applied to a signal input of the comparator with a reference voltage to be applied to a reference input of the comparator, in which at least two series-connected amplifier stages are provided which are connected in parallel with respect to a supply voltage.

Comparator circuits of this general type are of themselves conventional and may be of different construction. One possibility is to combine the two amplifier stages, each in the form of an inverter, into a flip-flop which is addressed on the one side, for example, by the memory content of an addressed binary storage cell and, on the other side, by the memory content of a reference cell which is constructed and dimensioned in the same manner as the storage cell. Another possibility is to use a comparator constructed as a differential amplifier, the two branches of which are realized as MOS transistors.

Comparators of such construction, however, are little suited for use in high-speed analog-to-digital converters.

As is well known, high-speed analog-to-digital converters can be constructed from parallel-operating voltage comparators. In a purely parallel operating analog-to-digital converter with n-bit resolution, a total of $(2^n - 1)$ such comparators is required. In a monolithic realization thereof, this has the disadvantage that an area of considerable size is required for containing the circuit on the semiconductor chip, unless one is satisfied with a relatively small number of bits for the A/D converter. In addition, the heretofore known comparator cells lead to considerable current consumption. It would therefore be desirable to construct the individual comparator cells so that they have a very small area and need only little current.

It is further important to make the variations or deviations of the evaluation or weighting threshold from one comparator to another smaller than the desired resolution. These variations or deviations are in the order of magnitude of 50 mV when the transistors are realized in MOS technology, because of the relative variation or deviation of the threshold voltage of MOS transistors. With an excursion of the measuring voltage of 3 V, the resolution would thereby be limited to about 5 bits. Frequently, however, a resolution of 7 or even 8 bits is required.

Finally, it should be noted that the excursion of the measuring voltage of 3 V, as is required in such and other cases, is large in comparison with the supply voltage of 3.5 to 5 V which must be used for integrated circuits for well-known reasons. In this large range for the signal input voltage, the comparator should be sufficiently fast and sensitive in order to be able to compare the input signal with the reference signal.

Heretofore known solutions of the last-mentioned problems are based upon the use of inverters constructed from complementary MOS transistors. While a realization in CMOS technology, indeed, has the advantage of being energy-saving, it nevertheless is accompanied by the disadvantage of greater space requirements on the semiconductor chip and the disadvantage of considerably higher manufacturing costs.

It is accordingly an object of the invention to provide a comparator which meets the hereinaforementioned requirements, can be realized in single-channel MOS technology, especially in n-channel technology, and requires only limited space.

With the foregoing and other objects in view, there is provided, in accordance with the invention, a circuit of a monolithically integrable MOS-comparator for comparing a signal voltage applied to a signal input of the comparator with a reference voltage applied to a reference input of the comparator including a plurality of serially connected amplifier stages connected in parallel with respect to a supply voltage, comprising a capacitor having a first and a second pole, the signal input and the reference input of the comparator being alternatingly connected to the first pole of the capacitor via respective first and second clock-controlled transfer transistors, a first one of the amplifier stages being formed as an inverter and having a control input and an output, the second pole of the capacitor being directly connected to the control input of the first amplifier stage and being also connected via a third transfer transistor to the output of the first amplifier stage, a second one of the amplifier stages also formed as an inverter and having a control input and an output, the output of the first amplifier stage being further connected via a fourth transfer transistor to the control input of the second amplifier stage, a third one of the amplifier stages also formed as an inverter and being identical with the first and second amplifier stages, the third amplifier stage having a signal input and an output, the output of the second amplifier stage being a first signal of the comparator and being also connected to the signal input of the third amplifier stage, the output of the third amplifier stage being a second signal output of the comparator and being connected via a fifth transfer transistor to the control input of the second amplifier stage, and means for transmitting two clock signals connected to the first and second transfer transistors, respectively, for alternatingly switching the signal input and the reference input, respectively, of the comparator to the capacitor, the signals being matched with one another so that a pulse of one of the clock signals always appears in a pause between two consecutive pulses of the other of the clock signals, the signal-transmitting means being also connected to the third, fourth and fifth transfer transistors for controlling the same so that the connection of the capacitor to the output of the first amplifier stage, as well as the connection of the input of the second amplifier stage to the output of the third amplifier stage is controlled by the one clock signal, and the connection of the output of the first amplifier stage to the signal input of the second amplifier stage is controlled by the other clock signal.

The one clock signal may be identical with the clock signal switching the reference input to the capacitor, and the other clock signal may be identical with the clock signal switching the signal input to the capacitor, as is the case in the circuit of the comparator according to the invention shown in FIG. 1. However, the roles of the two pulse sequences controlling the input transfer transistors may be interchanged for controlling the remaining transfer transistors.

In other words, the invention resides in a multistage MOS amplifier realized, for example, in n-channel technology, which is switched-over in such a way that, in a first clock phase, all three series-connected amplifier stages (realized, respectively by inverters) produce a high gain and that, then, in a second clock phase, the two last amplifier stages are connected to form a flip-flop which then, due to its own feedback, amplifies the signal to such an extent that a logical decision is produced and acts, until the end of this clock phase, as digital information on the output.

Both the second and the third amplifier stage are dimensioned or designed exactly like the first amplifier stage, so that the operating point $U_{in}=U_o$ ($U_o$=operating point voltage) applies largely to all three amplifier stages. Thus, the chain of the three amplifier stages i.e. the three inverters, operates in the sensitive region if the signal voltage is substantially equal to the reference voltage. During the measuring phase i.e. when the three amplifier stages are connected in series, the output voltage adjusts itself at the output of the amplifier chain i.e. at the output of the third inverter, in accordance with the difference between the signal voltage and the reference voltage. During the other clock phase, during which the first inverter representing the first amplifier stage is negatively fed back, the two following amplifier stages are separated from the input wtage and are fed back in the form of a flip-flop via a transfer switch which is represented by the fourth transfer transistor mentioned in the foregoing definition of the invention. This flip-flop settles very rapidly to digital levels and stores the information until the next measuring phase for the signal input voltage.

It is a considerable advantage of the arrangement or circuit according to the invention that the time during which the first inverter or amplifier stage has negative feedback, is utilized also in the second and third inverter or amplifier stage, namely for post-amplification and storage. It is another advantage that the double utilization of the second and third inverter or amplifier stage permits savings in area and power loss or dissipation.

With a circuit or arrangement according to the invention, the output signal of the flip-flop formed temporarily by the second and third inverter or amplifier stage is available at the signal output is shortened, it is true. This digital signal is of importance, however, only for transferring the signal into the circuit to be addressed by the comparator, for example, a priority logic and a decoder, so that the shortening of time causes no disadvantages.

Other features which are considered as characteristic for the invention are set forth in the appended claims.

Although the invention is illustrated and described herein as embodied in monolithically integrable MOS-comparator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings in which.

Figure 1:
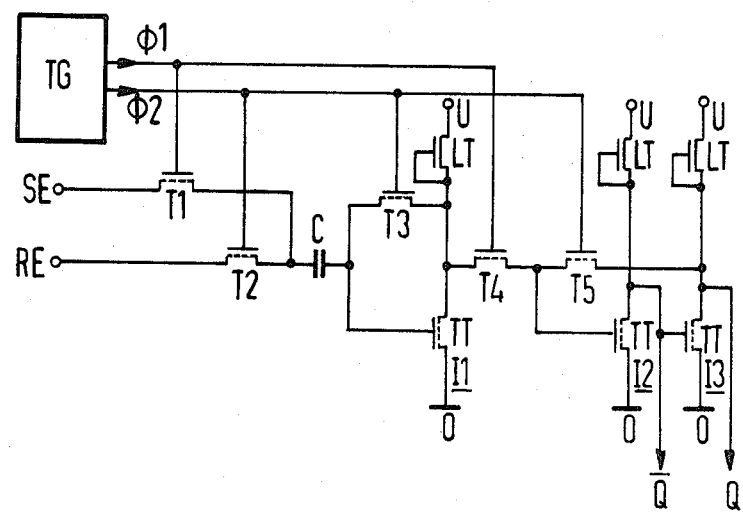
FIG. 1 is a circuit diagram of the comparator according to the invention.
Figure 1A:
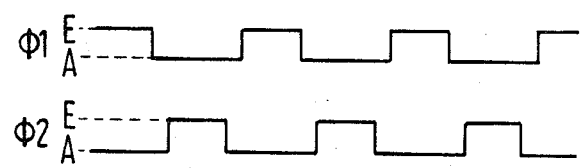
FIG. 1a is a timing diagram for the operation of the comparator according to FIG. 1.

Referring now to the drawing and first, particularly to FIG. 1 thereof, there is shown a diagram of a monolithically integrable MOS-comparator circuit wherein a signal input SE is connected via a first transfer transistor T1, and a reference input RE via a second transfer transistor T2, to the same pole of a capacitor C, which is realized, for example, as an MOS capacitor. The first transfer transistor T1 has a gate controlled by a clock pulse sequence $\phi_1$, and the gate of the second transfer transistor T2 by a clock pulse sequence $\phi_2$. The waveform of the pulse sequences $\phi_1$ and $\phi_2$, delivered by a clock generator TG, is shown in FIG. 1a. Such a clock generator TG is described in German Published Non-Prosecuted Application (DE-OS) No. 27 13 319.

The transfer transistors T1, T2 as well as the other transistors T3 and T5 are of the self-blocking type. That applies as well to the driver transistors TT of inverters I1, I2 and I3. Output transistors LT in the inverters I1, I2 and I3 in FIG. 1 are self-conducting. Self-blocking output transistors IT can also be used, however, if the circuit is modified accordingly. In the case of the illustrated embodiment, all of the transistors are of the n-channel type which, in the interest of higher switching speed, is more advantageous than the likewise possible use of p-channel MOS FETs. Preferably, the driver transistors TT, on the one hand, and the output transistors LT, on the other hand, as well as the transfer transistors T1 to T6 are all of like or equal dimensions, so that a minimum of relative tolerances results during manufacture thereof.

The capacitor C addressed at one pole thereof by the signal input SE or the reference input RE. Respectively, is connected, as is apparent from FIG. 1, by the other pole thereof directly to the input of the inverter forming the first amplifier stage I1 and realized by the gate of the driver transistor TT appertaining thereto. The latter is connected by the source terminal to reference potential 0 V and by the drain thereof to the output of the inverter I1, as well as to the first supply potential U via the source-drain path of the diode-like connected output transistor LT of the inverter I1.

The output of the first inverter I1 leads back, via the third transfer gate T3 controlled by the reference clock $\phi_2$, to the control input of the first inverter I1, i.e. to the gate of the driver transistor TT thereof. The signal output of the first inverter I1 is connected, furthermore, via the fourth transfer transistor T4, which is controlled by the signal clock $\phi_1$ connecting the signal input SE to the capacitor C, to the control input of the second inverter I2 and, consequently, of the second amplifier stage of the comparator according to the invention. The signal output of the second inverter I2 is connected, according to the definition of the invention, to the control input of a third inverter I3 and, thereby, to the gate of the driver transistor TT of this inverter I3. The three inverters I1, I2, I3 are completely alike as to construction as well as with respect to the connection thereof to reference potential O and to the supply voltage U.

According to the definition of the invention, the output of the third inverter I3 is connected to the input of the second inverter I2 via a fifth transfer transistor T5. The output of the third inverter I3 forms the Q-output of the RS-flip-flop made up of the inverters I2 and I3 through appropriate connection of the transfer transistors TT thereof, while the $\overline{Q}$-output of this flip-flop is identical with the signal output of the second inverter I2. The two outputs Q and $\overline{Q}$ are the signal output of the comparator according to the invention.

If self-blocking MOS-field effect transistors are used as the output transistors LT, instead of connecting the gate of these transistors as shown in FIG. 1, for example, the gate can be connected to the drain i.e. the supply potential U. As further explanation, the use of the described comparator cell is further described hereinafter with reference to FIG. 2.

Figure 2:
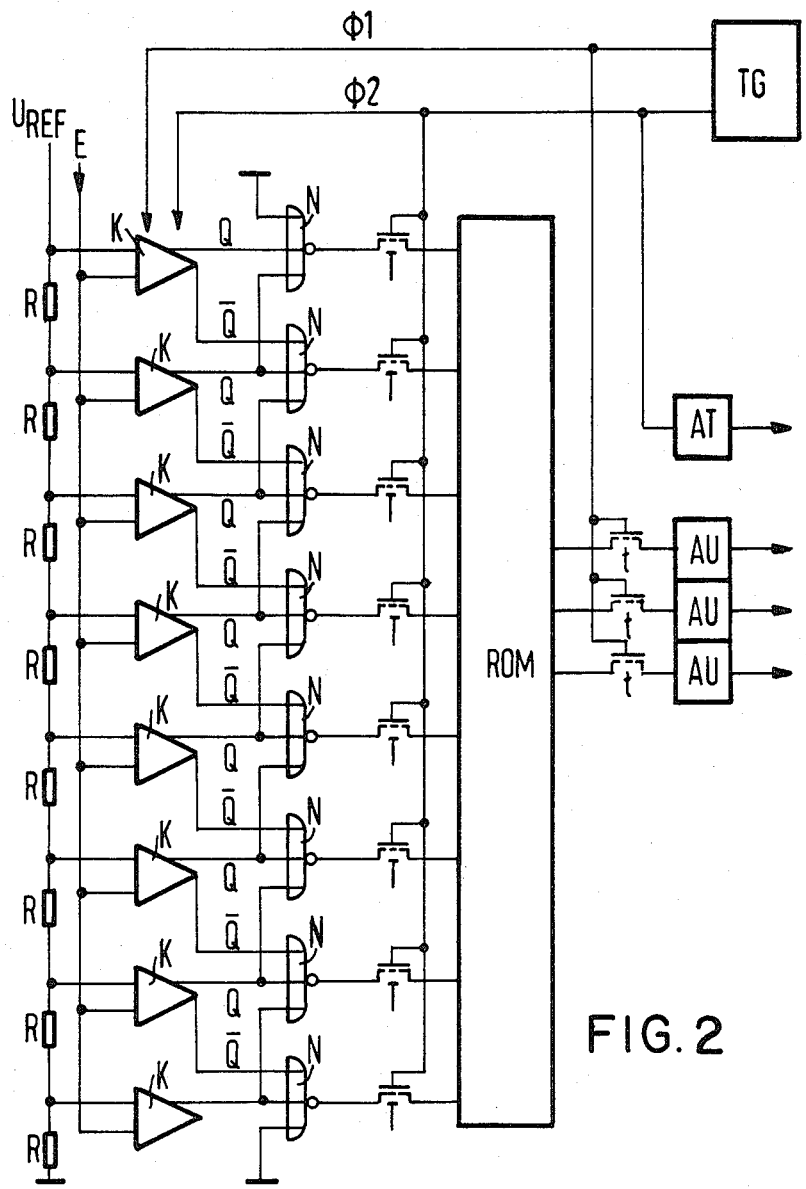
FIG. 2 is a block diagram showing the application of the comparator according to FIG. 1 in a circuit operating according to the parallel method for an analog-to-digital converter.

In the block diagram of an analog-to-digital A/D converter operating in parallel mode according to FIG. 2, comparators K, each according to FIG. 1, are provided in number corresponding to the desired resolution N, and have signal inputs SE (not specifically illustrated otherwise in FIG. 2) which are connected to a signal input E of the A/D converter addressed by the analog signal to be evaluated. A chain of n series-connected and equal resistors R connected between the supply potential $U_{REF}$ and reference potential forms a voltage divider having taps which are associated, respectively, with one of the comparators K, each tap being connected to the reference input RE (not otherwise specifically shown in FIG. 2) of a respective one of the comparators K which are provided.

With each of the comparators K, there is associated a respective NOR gate N respectively having three signal inputs, the not-inverting output Q of this comparator K being connected to one signal input of the corresponding NOR gate N. In addition, the $\overline{Q}$-output of the individual comparators K is tied to a second signal input of the NOR gate N which is associated with the weighting or evaluation stage lying one bit lower i.e. with the comparator K thereof. An exception is formed by the NOR gate N assigned to the comparator K of the least significant weighting stage, as is apparent from FIG. 2. Finally, the Q-output of the individual comparators K is connected to a further input of the NOR gate N which is assigned to or associated with the respective next-higher weighting stage. The NOR gate assigned to or associated with the most significant weighting stage forms an exception apparent from FIG. 2. The NOR gates N serve for converting the code into the form "1-of-n" i.e. in the case of FIG. 2, into the form "1-of-8".

The output of the individual NOR gates N leads via a respective transistor T to a respective input of a code converter which is realized, for example, by a read-only memory ROM. The latter serves for converting the code into a binary code. The clock signal $\phi_2$ is provided for controlling the transfer transistors T and, in accordance with the definition of the invention, serves for controlling the third and the fifth transfer transistor i.e. the transistors T3 and T5 of the comparator shown in FIG. 1. The clock generator TG furnishes the signal $\phi_1$ and $\phi_2$ which are provided for the common control of the n comparators K.

Every comparator K of the circuit shown in FIG. 2 compares the analog signal voltage applied to the signal input E to the respective reference voltage associated therewith due to the connection to the voltage divider. As viewed in FIG. 2, the comparators K for which the signal voltage is lower than the reference voltage (upper group) deliver a logical "1" at the output thereof, and the rest of the comparators K (lower group) a logical "0". The information of interest is located at the point at which the transition from the lower group to the upper group of comparators K occurs. The NOR gates N determine the point of this transition. Due to the circuit according to FIG. 2, apparently only that NOR gate N of which the upper adjacent comparator K (i.e. the comparator of the next-higher weighting stage) supplies the signal logical "0" at the inverting output $\overline{Q}$ thereof, will assume the logical "1" state at the output thereof.

The signal at the Q-output of the respective lower adjacent comparator (i.e. the comparator with the next-lower weighting stage) is tied to a third input of the NOR gate N assigned to the weighting stage under consideration and therefore acts in the sense of a priority formation if a comparator operates incorrectly and has an offset error of two steps. Without this priority formation, two NOR gates would then go to logical "1" at the output thereof. The NOR gates N form a "1-of-n" code from the "x-of-n" code of the comparators K.

Via the transfer transistors T, the "1-of-n" code signal is transmitted to a read-only memory ROM which converts this signal into a binary code. The signal outputs of the read-only memory ROM are connected via a respective transfer transistor t to the input of a respective amplifier AU, the outputs of which, in the totality thereof, furnish the binary digital signal corresponding to the applied analog signal E. That one of the two clock signals $\phi_1$ and $\phi_2$, namely the clock signal $\phi_1$ which, according to the definition of the invention, is intended for controlling the fourth transfer transistor T4 in the provided comparators K, serves for controlling the transfer transistors t. The other clock signal $\phi_2$ goes to the input of an amplifier AT corresponding to the amplifiers AU. The signal appearing at the output of this amplifier AT forms the clock frequency in the weighting of the digital output signal of the converter delivered at the totality of the output amplifiers AU.

The separation of the signal pass or traversal through transfer transistors T and t which are clocked, staggered or displaced as to time, affords a longer switching time for the gates, as compared to a circuit with direct signal passage, given the same information throughput. In addition, the output of the signals is synchronized even if the gate propagation times are different.

The transfer transistors T and t correspond advantageously, with respect to the construction or design thereof, to the transfer transistors in the comparators K.

There are claimed:

1. Circuit of a monolithically integrable MOS-comparator for comparing a signal voltage applied to a signal input of the comparator with a reference voltage applied to a reference input of the comparator including a plurality of serially connected amplifier stages connected in parallel with respect to a supply voltage, comprising a capacitor having a first and a second pole, the signal input and the reference input of the comparator being alternatingly connected to said first pole of said capacitor via respective first and second clock-controlled transfer transistors, a first one of the amplifier stages being formed as an inverter and having a control input and an output, said second pole of said capacitor being directly connected to said control input of said first amplifier stage and being also connected via a third transfer transistor to said output of said first amplifier stage, a second one of the amplifier stages also formed as an inverter and having a control input and an output, said output of said first amplifier stage being further connected via a fourth transfer transistor to said control input of said second amplifier stage, a third one of the amplifier stages also formed as an inverter and being identical with said first and second amplifier stages, said third amplifier stage having a signal input and an output, said output of said second amplifier stage being a first signal output of the comparator and being also connected to said signal input of said third amplifier stage, said output of said third amplifier stage being a second signal output of the comparator and being connected via a fifth transfer transistor to said control input of said second amplifier stage, and means for transmitting two clock signals connected to said first and second transfer transistors, respectively, for alternatingly switching the signal input and the reference input, respectively, of the comparator to said capacitor, said signals being matched with one another so that a pulse of one of said clock signals always appears in a pause between two consecutive pulses of the other of said clock signals, said signal-transmitting means being also connected to said third, fourth and fifth transfer transistors for controlling the same so that said connection of said capacitor to said output of said first amplifier stage, as well as said connection of said input of said second amplifier stage to said output of said third amplifier stage is controlled by said one clock signal, and said connection of said output of said first amplifier stage to said signal input of said second amplifier stage is controlled by said other clock signal.

2. Comparator circuit according to claim 1 wherein said one clock signal controlling said connection of the signal input of the comparator to said capacitor is also for controlling said fourth transfer transistor for connecting said output of said first amplifier stage to said control input of said second amplifier stage.

* * * * *